(12) United States Patent
Tsai et al.

(10) Patent No.: US 12,260,321 B2
(45) Date of Patent: Mar. 25, 2025

(54) DATA FEATURE AUGMENTATION SYSTEM AND METHOD FOR LOW-PRECISION NEURAL NETWORK

(71) Applicant: INDUSTRIAL TECHNOLOGY RESEARCH INSTITUTE, Hsinchu (TW)

(72) Inventors: Fu-Cheng Tsai, Tainan (TW); Yi-Ching Kuo, Tainan (TW); Chih-Sheng Lin, Tainan (TW); Shyh-Shyuan Sheu, Zhubei (TW); Tay-Jyi Lin, Kaohsiung (TW); Shih-Chieh Chang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 912 days.

(21) Appl. No.: 17/385,316

(22) Filed: Jul. 26, 2021

(65) Prior Publication Data

US 2022/0318605 A1 Oct. 6, 2022

(30) Foreign Application Priority Data

Mar. 31, 2021 (TW) .................................. 110111849

(51) Int. Cl.
*H03M 1/12* (2006.01)
*G06N 3/04* (2023.01)
(Continued)

(52) U.S. Cl.
CPC .............. *G06N 3/063* (2013.01); *G06N 3/04* (2013.01); *H03M 1/1245* (2013.01); *G11C 27/02* (2013.01); *H03M 1/12* (2013.01)

(58) Field of Classification Search
CPC ........ H03M 1/1245; H03M 1/12; H03M 1/36; G06N 3/02; G06N 3/04
(Continued)

(56) References Cited

U.S. PATENT DOCUMENTS

| 4,398,179 A * | 8/1983 | Kaneko | ................. H03M 1/201 341/131 |
| 8,423,360 B2 | 4/2013 | Koshiba et al. | |

(Continued)

FOREIGN PATENT DOCUMENTS

| CN | 107729953 A | 2/2018 |
| CN | 108694442 A | 10/2018 |

(Continued)

OTHER PUBLICATIONS

Hubara et al., "Binarized Neural Networks," 30th Conference on Neural Information Processing Systems Barcelona, Spain, 2016, pp. 1-9.

(Continued)

*Primary Examiner* — Peguy Jean Pierre
(74) *Attorney, Agent, or Firm* — Birch, Stewart, Kolasch & Birch, LLP

(57) ABSTRACT

A data feature augmentation system and method for a low-precision neural network are provided. The data feature augmentation system includes a first time difference unit. The first time difference unit includes a first sample-and-hold circuit and a subtractor. The first sample-and-hold circuit is used for receiving an input signal and obtaining a first signal according to the input signal. The first signal is related to a first leakage rate of the first sample-and-hold circuit and the first signal is the signal generated by delaying the input signal by one time unit. The subtractor is used for performing subtraction on the input signal and the first signal to obtain a time difference signal. The input signal and (Continued)

the time difference signal are inputted to the low-precision neural network.

17 Claims, 8 Drawing Sheets

(51) Int. Cl.
    *G06N 3/063*     (2023.01)
    *G11C 27/02*     (2006.01)

(58) Field of Classification Search
    USPC .................................. 341/155, 159, 122
    See application file for complete search history.

(56) References Cited

U.S. PATENT DOCUMENTS

| | | | |
|---|---|---|---|
| 9,721,559 | B2 | 8/2017 | Cui et al. |
| 10,546,217 | B2 | 1/2020 | Albright et al. |
| 11,101,810 | B1* | 8/2021 | Veldhoven .......... H03M 1/0626 |
| 2015/0042496 | A1* | 2/2015 | Straeussnigg ............ H04R 3/00 |
| | | | 341/118 |
| 2015/0161994 | A1 | 6/2015 | Tang et al. |
| 2017/0110142 | A1 | 4/2017 | Fan et al. |
| 2017/0200092 | A1 | 7/2017 | Kisilev |
| 2019/0043482 | A1 | 2/2019 | Li et al. |

FOREIGN PATENT DOCUMENTS

| | | |
|---|---|---|
| CN | 110335584 A | 10/2019 |
| CN | 110827837 A | 2/2020 |
| TW | 201833819 A | 9/2018 |
| TW | 201843998 A | 12/2018 |
| TW | 202025172 A | 7/2020 |

OTHER PUBLICATIONS

Jiang et al., "XNOR-SRAM: In-Memory Computing SRAM Macro for Binary/Ternary Deep Neural Networks," Symposium on VLSI Technology Digest of Technical Papers, 2018, pp. 173-174.

Kim et al., "In-Memory Batch-Normalization for Resistive Memory based Binary Neural Network Hardware," ASPDAC, Association for Computing Machinery, 2019, pp. 1-6.

Rastegari et al., "XNOR-Net: ImageNet Classification Using Binary Convolutional Neural Networks," XNOR-Net: ImageNet Classification Using Binary Convolutional Neural Networks, 2016, pp. 1-17.

Shafiee et al., "ISAAC: A Convolutional Neural Network Accelerator with In-Situ Analog Arithmetic in Crossbars," ACM/IEEE 43rd Annual International Symposium on Computer Architecture, 2016, pp. 14-26.

Taiwanese Office Action and Search Report for Taiwanese Application No. 110111849, dated Dec. 7, 2021.

* cited by examiner

DATA FEATURE AUGMENTATION SYSTEM AND METHOD FOR LOW-PRECISION NEURAL NETWORK

This application claims the benefit of Taiwan application Serial No. 110111849, filed Mar. 31, 2021, the disclosure of which is incorporated by reference herein in its entirety.

TECHNICAL FIELD

The disclosure relates in general to a data feature augmentation system and method, and more particularly to a data feature augmentation system and method for a low-precision neural network.

BACKGROUND

Neural network (NN) can be used in various fields such as image recognition and speech recognition. The application of neural network involves a large amount of computation, such as hundred millions of multiplication and addition, and needs to be equipped with relevant expensive hardware to achieve the desired efficiency of the neural network. To resolve the problem of hardware resource consumption associated with the large amount of computation, a method is provided to reduce the amount of computation by reducing the precision of the neural network and converting the original high-precision neural network to a low-precision neural network.

Although the method can reduce the hardware resources consumption by reducing the amount of computation, the prediction accuracy of low-precision neural network will be decreased. Therefore, it has become a prominent task for the industries to reduce the amount of computation of the neural network and at the same time increase the prediction accuracy of the neural network.

SUMMARY

The present disclosure relates to a data feature augmentation system and a method for a low-precision neural network. The feature of input data is augmented using time difference calculation, such that the prediction accuracy of low-precision neural network can be assured.

According to one embodiment, a data feature augmentation system for a low-precision neural network is provided. The data feature augmentation system includes a first time difference unit. The first time difference unit includes a first sample-and-hold circuit and a subtractor. The first sample-and-hold circuit is used for receiving an input signal and obtaining a first signal according to the input signal. The first signal is related to a first leakage rate of the first sample-and-hold circuit and is the first signal the signal generated by delaying the input signal by one time unit. The subtractor is used for performing subtraction on the input signal and the first signal to obtain a time difference signal. The input signal and the time difference signal are inputted to the low-precision neural network.

According to another embodiment, a data feature augmentation method for a low-precision neural network is provided. The data feature augmentation method includes the following steps. An input signal is received and a first signal is obtained according to the input signal. The first signal is related to a first leakage rate of a first sample-and-hold circuit and the first signal is the signal generated by delaying the input signal by one time unit. Subtraction is performed on the input signal and the first signal to obtain a time difference signal. The input signal and the time difference signal are inputted to the low-precision neural network.

The above and other aspects of the disclosure will become better understood with regard to the following detailed description of the preferred but non-limiting embodiment(s). The following description is made with reference to the accompanying drawings.

Figure 1:
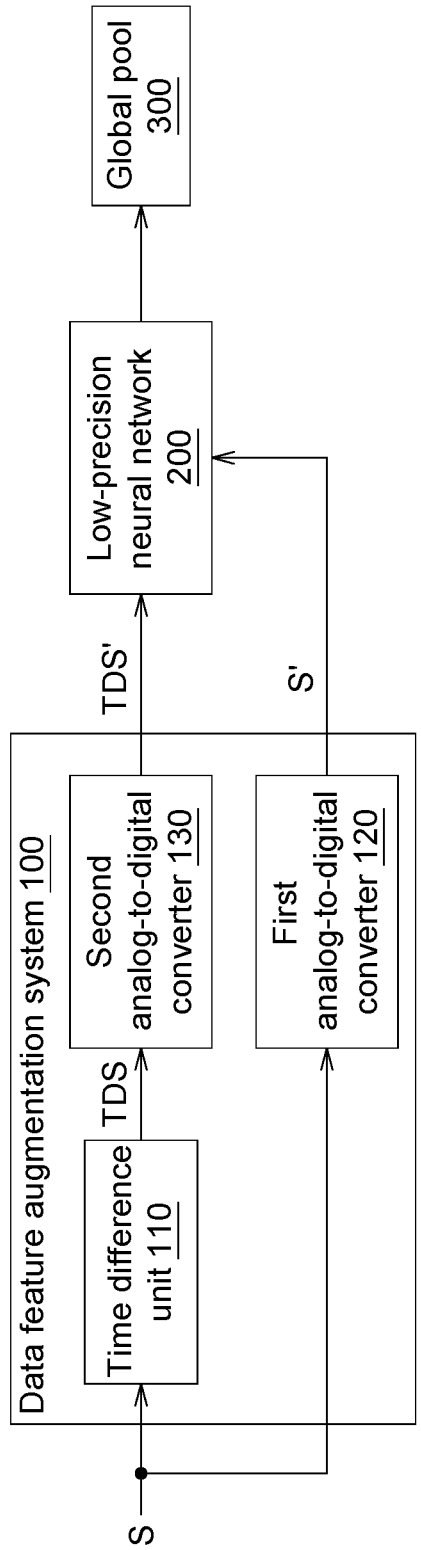
FIG. 1 is a block diagram of a data feature augmentation system, a low-precision neural network and a global pool according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIG. 1, a block diagram of a data feature augmentation system 100, a low-precision neural network 200 and a global pool 300 according to an embodiment of the present disclosure is shown. The data feature augmentation system 100 includes a time difference unit 110 and selectively includes a first analog-to-digital converter 120 and a second analog-to-digital converter 130. The first analog-to-digital converter 120 and the second analog-to-digital converter 130 both are low-resolution analog-to-digital converters. The time difference unit 110 can receive an input data, such as an input signal S, and output a time difference signal TDS. The input signal S and the time difference signal TDS are analog signals. The input signal S and the time difference signal TDS can be directly inputted to the low-precision neural network 200.

In an embodiment, before the input signal S and the time difference signal TDS are inputted to the low-precision neural network 200, the input signal S and the time difference signal TDS are respectively inputted to the first analog-to-digital converter 120 and the second analog-to-digital converter 130. The first analog-to-digital converter 120 converts the input signal S into a corresponding digital signal S'. The second analog-to-digital converter 130 converts the time difference signal TDS into a corresponding digital signal TDS'. Then, the digital signal S' and the digital signal TDS' are inputted to the low-precision neural network 200. The low-precision neural network 200 can be a binarized neural network or a short-wordlength neural network. Then, the output of the low-precision neural network 200 is inputted to the global pool 300 to be processed with global pooling operation.

In the present disclosure, the time difference unit 110 performs time difference calculation on the input signal S to obtain the time difference signal TDS, such that the feature of the input signal S can be augmented. The input signal S and the time difference signal TDS can be used as an input of the low-precision neural network 200, and the prediction accuracy of the low-precision neural network 200 can be increased. Furthermore, when the input signal S and the time difference signal TDS are converted into digital signals which are then inputted to the low-precision neural network 200, low-resolution analog-to-digital converters can be used to save hardware cost without affecting the prediction accuracy of the low-precision neural network 200.

The method for obtaining the time difference signal TDS by the time difference unit 110 according to the input signal S can have several implementations exemplified below.

Figure 2:
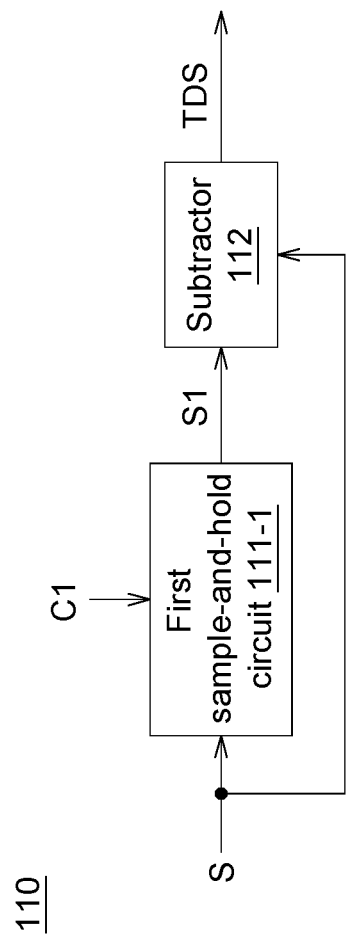
FIG. 2 is a block diagram of a time difference unit according to an embodiment of the present disclosure.
Figure 3:
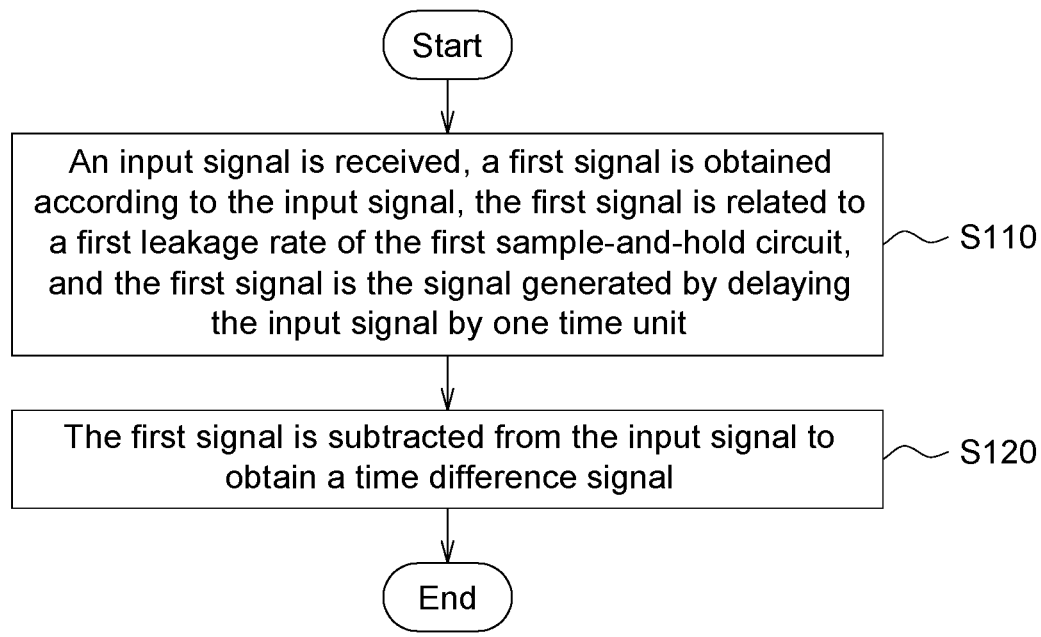
FIG. 3 is a flowchart of a data feature augmentation method for a low-precision neural network according to an embodiment of the present disclosure.

Refer to FIGS. 1 to 3. FIG. 2 is a block diagram of a time difference unit 110 according to an embodiment of the present disclosure. FIG. 3 is a flowchart of a data feature augmentation method for a low-precision neural network 200 according to an embodiment of the present disclosure. In an embodiment, the time difference unit 110 includes a first sample-and-hold circuit 111-1 and a subtractor 112, as indicated in FIG. 2.

In step S110, an input signal S is received by the first sample-and-hold circuit 111-1 and a first signal S1 is obtained according to the input signal S. The first signal S1 is related to a first leakage rate of the first sample-and-hold circuit 111-1 and the first signal S1 is the signal generated by delaying the input signal S by one time unit. Specifically, the first sample-and-hold circuit 111-1 samples and holds the input signal S and controls the first leakage rate of the first sample-and-hold circuit 111-1 to obtain the first signal S1. The first signal S1 can be expressed as C1*[S-1], wherein the signal [S-1] is the signal generated by delaying the input signal S by one time unit; C1 represents a first coefficient related to the first leakage rate and is between 0.5 and 1. The first leakage rate is adjustable, that is, the value of the first coefficient C1 can be determined by adjusting the first leakage rate. The leakage rate is related to the RC constant of the sample-and-hold circuit and can be changed by adjusting the resistance or the capacitance of the sample-and-hold circuit. The electric charges stored in the capacitor of the sample-and-hold circuit for holding the sampling value are leaked to a certain ratio (about 50%-100%) to reduce the sampled value outputted from the sample-and-hold circuit. The leakage rate is a ratio of the voltage after leakage to the voltage before leakage.

In step S120, subtraction is perform on the input signal S and the first signal S1 to obtain a time difference signal TDS. For example, the first signal S1 is subtracted from the input signal S by the subtractor 112 to obtain a time difference signal TDS whose value can be expressed as TDS=S-C1*[S-1].

Figure 4:
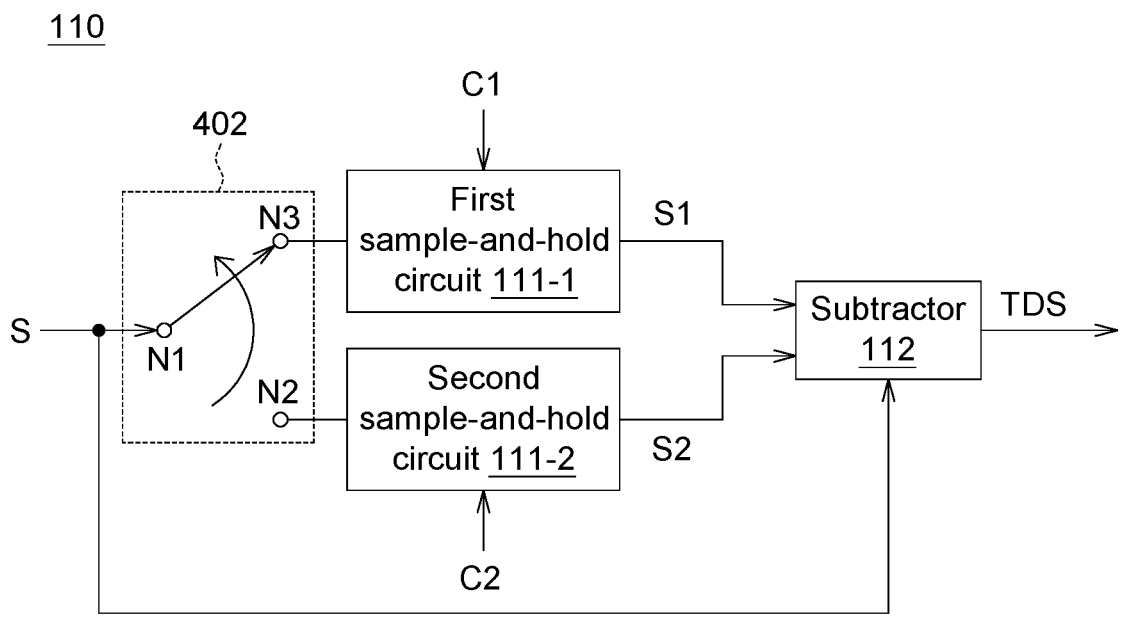
FIG. 4 is a block diagram of a time difference unit according to another embodiment of the present disclosure.
Figure 5:
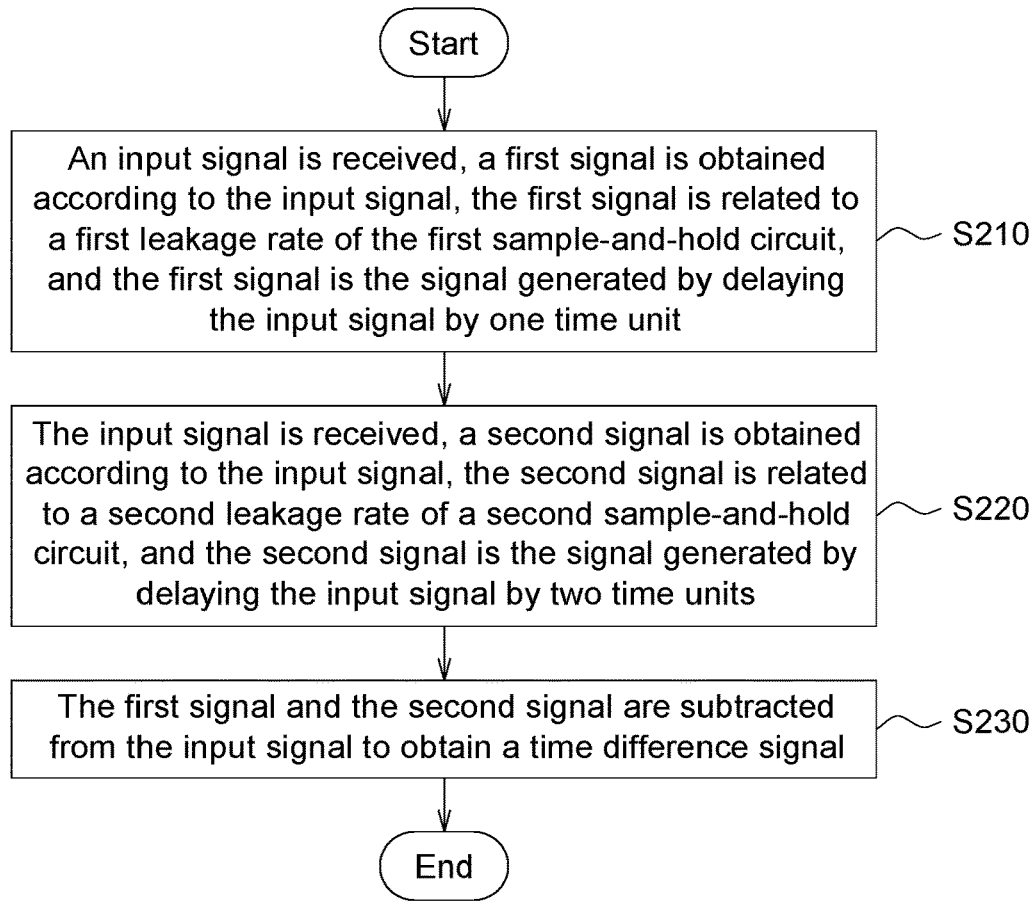
FIG. 5 is a flowchart of a data feature augmentation method for a low-precision neural network according to an embodiment of the present disclosure.

Refer to FIG. 1, 4, 5. FIG. 4 is a block diagram of a time difference unit 110 according to another embodiment of the present disclosure. FIG. 5 is a data feature augmentation method for a low-precision neural network 200 according to an embodiment of the present disclosure. In an embodiment, the time difference unit 110 includes a first sample-and-hold circuit 111-1, a second sample-and-hold circuit 111-2 and a subtractor 112. The first sample-and-hold circuit 111-1 and the second sample-and-hold circuit 111-2 are connected in parallel and the input signal S is outputted to one of the first sample-and-hold circuit 111-1 and the second sample-and-hold circuit 111-2 by a switch 402 as indicated in FIG. 4. The switch 402 can be implemented by a multiplexer.

In step S210, an input signal S is received by the first sample-and-hold circuit 111-1 and a first signal S1 is obtained according to the input signal S. The first signal S1 is related to a first leakage rate of the first sample-and-hold circuit 111-1 and the first signal is the signal generated by delaying the input signal S by one time unit. Details of the method for obtaining the first signal S1 by the first sample-and-hold circuit 111-1 are the same as described above, and are not repeated here. The first signal S1 can be expressed as C1*[S-1], wherein [S-1] is the signal generated by delaying the input signal S by one time unit (for example, the value of the first signal S1 is the value of the signal [S-1] multiplied by C1, and the value of [S-1] is the value of the input signal S one clock cycle ahead of the current time point); and C1 represents a first coefficient related to the first leakage rate and is between 0.5 and 1. The first leakage rate is adjustable. The value of the first coefficient C1 can be determined by adjusting the first leakage rate.

In step S220, the input signal S is received by the second sample-and-hold circuit 111-2 and a second signal S2 is obtained according to the input signal S. The second signal S2 is related to a second leakage rate of the second sample-and-hold circuit 111-2 and the second signal is the signal generated by delaying the input signal S by two time units. Specifically, the second sample-and-hold circuit 111-2 samples and holds the input signal S and controls the second leakage rate of the second sample-and-hold circuit 111-2 to obtain the second signal S2. The value of the second signal S2 can be expressed as C2*[S-2], wherein the signal [S-2] is the signal generated by delaying the input signal S by two time units (for example, the value of the second signal S2 is the value of the signal [S-2] multiplied by C2, wherein the value of [S-2] is the value of the input signal S two clock cycles ahead of the current input signal S); C2 represents a second coefficient related to the second leakage rate and the second coefficient C2 is between 0.5 and 1. The second leakage rate is adjustable. The value of the second coefficient C2 can be determined by adjusting the second leakage rate.

In step S230, subtraction is performed on the input signal S, the first signal S1, and the second signal S2 to obtain a time difference signal TDS. For example, the first signal S1 and the second signal S2 are subtracted from the input signal S by the subtractor 112 to obtain the time difference signal TDS whose value can be expressed as TDS=S-C1*[S-1]-C2*[S-2].

The present embodiment is exemplified by an example below. Suppose the input signal S is an audio signal which is continuously inputted data streaming. Also refer to Table 1 below, which lists the values of the input signal S, the first signal S1 and the second signal S2 between time point t1 and time point t3. At time point t1, the endpoint N1 of the switch 402 is electrically connected to the endpoint N2, such that the second sample-and-hold circuit 111-2 samples and holds the input signal S (the current value of the input signal S is, for example, S (t1)). At time point t2 (one clock cycle behind time point t1), the second sample-and-hold circuit 111-2 outputs the second signal S2 whose value is C2*[S-1], that is the value of the signal S one clock cycle ahead of time point t2 (i.e. [S-1]) multiplied by C2, such as C2*S(t1).

Similarly, at time point t2, the switch 402 switches and makes the endpoint N1 of the switch 402 electrically connected to the endpoint N3, such that the first sample-and-hold circuit 111-1 samples and holds the input signal S. At time point t3 (two clock cycles behind time point t1), the first sample-and-hold circuit 111-1 outputs the first signal S1 whose value is C1*[S-1], that is, the value of the first signal S1 one clock cycle ahead of time point t3 (i.e. [S-1]), such as C1*S(t2). AT time point t3, the second sample-and-hold circuit 111-2 continues to output the second signal S2, that is the value of the input signal S two clock cycles ahead of the time point t3 (i.e. [S-2]) multiplied by C2, such as C2*S(t1).

Meanwhile, at time point t3, the subtractor 112 receives the first signal S1 (whose value is C1*[S-1], such as C1*S (t2)) from the sample-and-hold circuit 111-1, the second signal S2 (whose value is C2*[S-2], such as C2*S(t1)) from the second sample-and-hold circuit 111-2 and the current input signal S whose value is S(t3). Then, the subtractor 112 performs subtraction on the received signals to obtain a time difference signal TDS whose value can be expressed as TDS=S-C1*[S-1]-C2*[S-2], such as S(t3)-C1*S(t2)-C2*S (t1).

TABLE 1

|  | Input signal S | First signal S1 | Second signal S2 |
| --- | --- | --- | --- |
| Time point t1 | S(t1) | N/A | N/A |
| Time point t2 | S(t2) | N/A | C2*S(t1) |
| Time point t3 | S(t3) | C1*S(t2) | C2*S(t1) |

Figure 6:
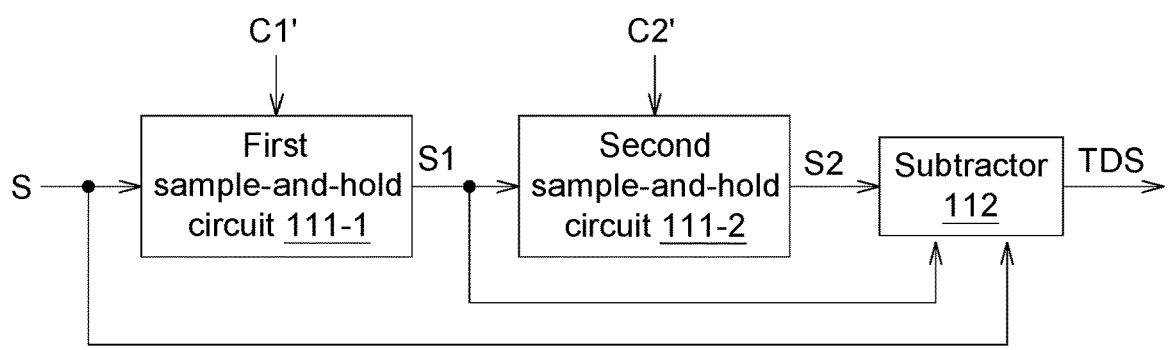
FIG. 6 is a block diagram of a time difference unit according to another embodiment of the present disclosure.

Referring to FIG. 6, a block diagram of a time difference unit 110 according to another embodiment of the present disclosure is shown. The first sample-and-hold circuit 111-1 and the second sample-and-hold circuit 111-2 are connected in parallel as indicated in FIG. 4. In another embodiment as indicated in FIG. 6, the first sample-and-hold circuit 111-1 and the second sample-and-hold circuit 111-2 can also be connected in series to perform steps S210 to S230. In FIG. 6, the time difference signal TDS obtained by the time difference unit 110 can be expressed as TDS=S-C1*[S-1]-C2*[S-2].

The present embodiment is exemplified by an example below. Suppose the input signal S is an audio signal which is a continuously inputted data streaming. Also refer to Table 2 below, which lists the values of the input signal S, the first signal S1, and the second signal S2 between time point t4 and time point t6. For example, at time point t4, the first sample-and-hold circuit 111-1 samples and holds the input signal S (the current value of the input signal S is S(t4)). At time point t5 (one clock cycle behind time point t4), the first sample-and-hold circuit 111-1 outputs the first signal S1 whose value is C1*[S-1], that is the value of the signal S one clock cycle ahead of time point t5 (i.e. [S-1]) multiplied by C1', such as C1'*S(t4), and C1'=C1. The first sample-and-hold circuit 111-1 again samples and holds the input signal S (the current value of the input signal S is S(t5)). Similarly, at time point t5, the second sample-and-hold circuit 111-2 also samples and holds the first signal S1 whose value is C1'*[S-1], such as C1'*S(t4).

At time point t6 (two clock cycles behind time point t4), the first sample-and-hold circuit 111-1 samples and holds the input signal S (the current value of the input signal S is S(t6)) again, and the first sample-and-hold circuit 111-1 outputs the first signal S1 whose value is C1'*[S-1], that is the value of the first signal S1 one clock cycle ahead of time point t6 (i.e. [S-1]) multiplied by C1', such as C1'*S(t5). C1'*S(t5) is also the product of the value of C1' multiplied by the value of the input signal S sampled by the first sample-and-hold circuit 111-1 at time point t5 and outputted from the first sample-and-hold circuit 111-1. Meanwhile, at time point t6, the second sample-and-hold circuit 111-2 samples and holds the first signal S1 whose value is, for example, C1'*S(t5). The second sample-and-hold circuit 111-2 outputs the second signal S2 whose value is C2'*[S1-1]=C2'*C1'*[S-2]. The second signal S2 is the value of the input signal S1 one clock cycle ahead of time point t6 ([S1-1]) multiplied by C2', such as C2'*S1(t5). The second signal S2 is also the value of the input signal S two clock cycles ahead of time point t6 ([S-2]) multiplied by C2' *C1', such as C2'*C1'*S(t4).

Thus, at time point t6, the subtractor 112 can receives the second signal S2 from the output end of the second sample-and-hold circuit 111-2 (the value of the second signal S2 can be expressed as C2'*C1'*[S-2]=C2*[S-2], wherein C2'*C1'=C2), the first signal S1 from the output end of the first sample-and-hold circuit 111-1 (the value of the first signal S1 can be expressed as C1*[S-1]) and the current input signal S. Then, the subtractor 112 performs subtraction on the received signals to obtain the value of the time difference signal TDS. The value of time difference signal TDS can be expressed as TDS=S-C1'*[S-1]-C1'*C2'*[S-2] =S-C1*[S-1]-C2*[S-2].

TABLE 2

|  | Input signal S | First signal S1 | Second signal S2 |
| --- | --- | --- | --- |
| Time point t4 | S(t4) | N/A | N/A |
| Time point t5 | S(t5) | C1'*S(t4) | N/A |
| Time point t6 | S(t6) | C1'*S(t5) | C2'*C1'*S(t4) |

Figure 7:
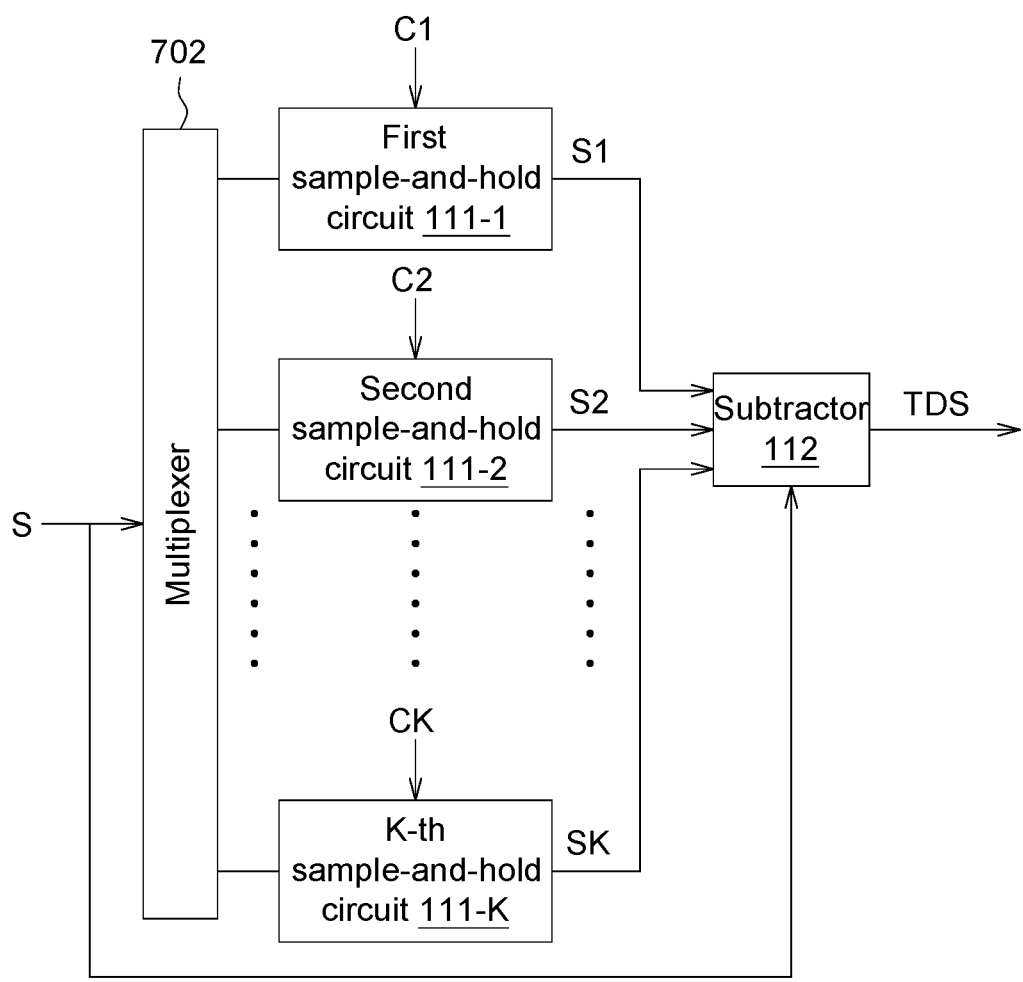
FIG. 7 is a block diagram of a time difference unit according to another embodiment of the present disclosure.

Referring to FIG. 7, a block diagram of a time difference unit 110 according to another embodiment of the present disclosure is shown. In an embodiment, the time difference unit 110 includes a first sample-and-hold circuit 111-1, a second sample-and-hold circuit 111-2, . . . , a K-th sample-and-hold circuit 111-K and a subtractor 112. The first sample-and-hold circuit 111-1, the second sample-and-hold circuit 111-2, . . . , and the K-th sample-and-hold circuit 111-K are connected in parallel and a multiplexer 702 enables the input signal S to be respectively inputted to the first sample-and-hold circuit 111-1, the second sample-and-hold circuit 111-2 . . . and the K-th sample-and-hold circuit 111-K at different time points as indicated in FIG. 7. In the present embodiment, the time difference signal TDS obtained by the time difference unit 110 can be expressed as TDS=S-C1*[S-1]-C2*[S-2]-, . . . , -CK*[S-K]. The signal [S-1] is the signal generated by delaying the input signal S by one time unit; C1 represents a first coefficient related to the first leakage rate and is between 0.5 and 1. The signal [S-2] is the signal generated by delaying the input signal S by two time units; C2 represents a second coefficient related to the second leakage rate and the second coefficient C2 is between 0.5 and 1. The signal [S-K] is the signal generated by delaying the input signal S by K time units; CK represents a K-th coefficient related to the K-th leakage rate and the K-th coefficient CK is between 0.5 and 1. The first leakage rate, the second leakage rate . . . , the K-th leakage rate are adjustable, and the values of the first coefficient C1, the second coefficient C2 . . . and the K-th coefficient CK can be respectively determined by adjusting the first leakage rate, the second leakage rate . . . , and the K-th leakage rate. Operations of the time difference unit 110 of FIG. 7 are similar to the operations of the time difference unit 110 of FIG. 4, and are not repeated here.

Figure 8:
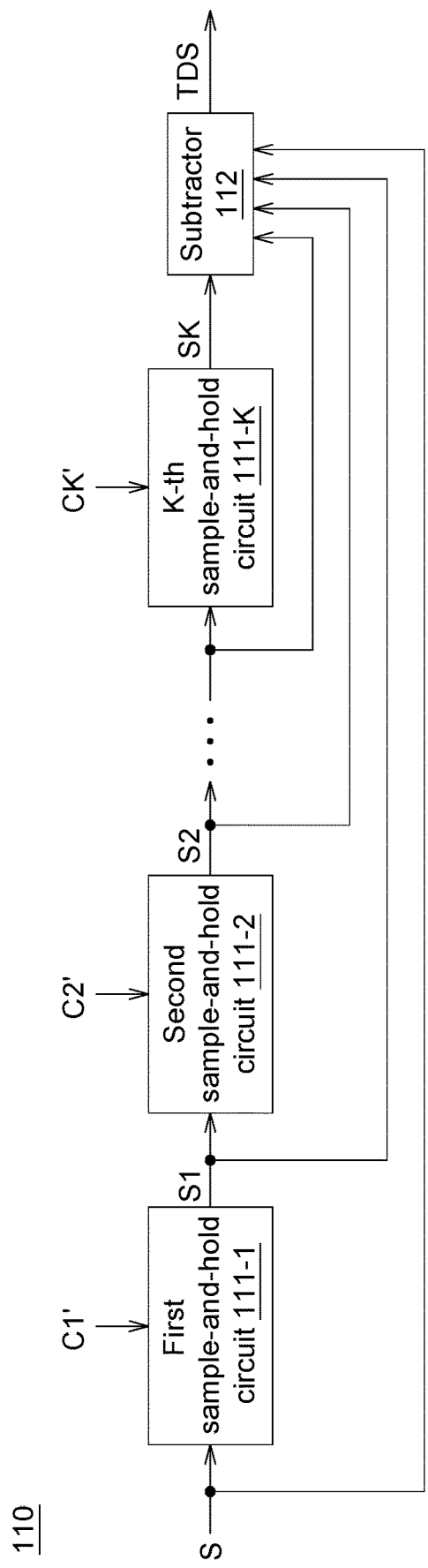
FIG. 8 is a block diagram of a time difference unit according to another embodiment of the present disclosure.

Referring to FIG. 8, a block diagram of a time difference unit 110 according to another embodiment of the present disclosure is shown. The first sample-and-hold circuit 111-1, the second sample-and-hold circuit 111-2, . . . , and the K-th sample-and-hold circuit 111-K are connected in parallel as indicated in FIG. 7. In another embodiment as indicated in FIG. 8, the first sample-and-hold circuit 111-1, the second sample-and-hold circuit 111-2, . . . , and the K-th sample-and-hold circuit 111-K can also be connected in series. The value of the time difference signal TDS obtained by the time difference unit 110 of FIG. 8 can be expressed as TDS=S-C1*[S-1]-C2*[S-2]-, . . . , -CK*[S-K].

Figure 9:
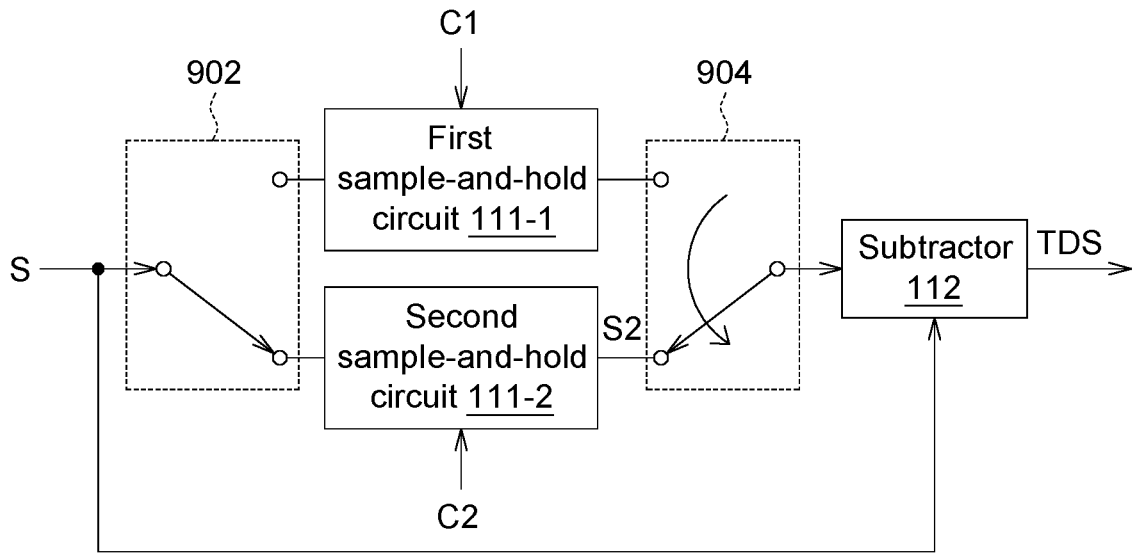
FIG. 9 is a block diagram of a time difference unit according to another embodiment of the present disclosure.
Figure 10:
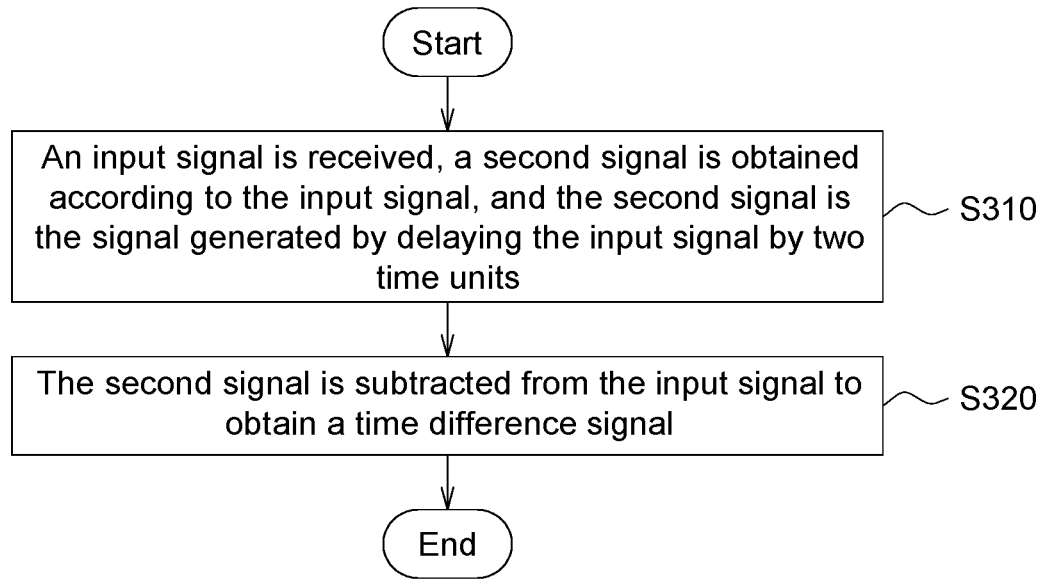
FIG. 10 is a flowchart of a data feature augmentation method for a low-precision neural network according to an embodiment of the present disclosure.

Refer to FIGS. 1, 9, 10. FIG. 9 is a block diagram of a time difference unit 110 according to another embodiment of the present disclosure. FIG. 10 is a flowchart of a data feature augmentation method for the low-precision neural network 200 according to an embodiment of the present disclosure. In an embodiment, the time difference unit 110 includes a first sample-and-hold circuit 111-1, a second sample-and-hold circuit 111-2 and a subtractor 112. The first sample-and-hold circuit 111-1 and the second sample-and-hold circuit 111-2 are connected in parallel. A switch 902 makes the input signal S to be inputted to the first sample-and-hold circuit 111-1 or the second sample-and-hold circuit 111-2. Another switch 904 makes the output of the first sample-and-hold circuit 111-1 or the output of the second sample-and-hold circuit 111-2 to be inputted to the subtractor 112 as shown in FIG. 9. In the exemplification below, the switch 902 makes the input signal S to be inputted to the second sample-and-hold circuit 111-2 and the switch 904 makes the output of the second sample-and-hold circuit 111-2 to be inputted to the subtractor 112. Each of the switch 902 and the switch 904 can also be implemented by a multiplexer.

In step S310, an input signal S is received by the second sample-and-hold circuit 111-2 and a second signal S2 is obtained according to the input signal S. The second signal S2 is related to a second leakage rate of the second sample-and-hold circuit 111-2 and the second signal S2 is the signal generated by delaying the input signal S by two time units. Specifically, the second sample-and-hold circuit 111-2 samples and holds the input signal S and controls the second leakage rate of the second sample-and-hold circuit 111-2 to obtain the second signal S2. The second signal S2 can be expressed as C2*[S-2], wherein the signal [S-2] is the signal generated by delaying the input signal S by two time units and C2 represents a second coefficient related to the second leakage rate and is between 0.5 and 1. The second leakage rate is adjustable, that is, the value of the second coefficient C2 can be determined by adjusting the second leakage rate.

In step S320, perform subtraction on the input signal S and the second signal S2 by the subtractor 112 to obtain a time difference signal TDS. For example, the second signal S2 is subtracted from the input signal S by the subtractor 112 to obtain a time difference signal TDS whose value can be expressed as TDS=S-C2*[S-2].

Figure 11:
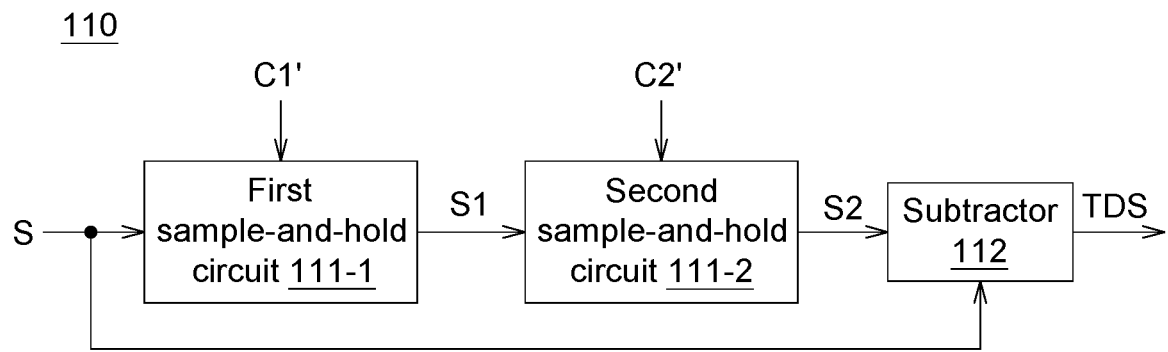
FIG. 11 is a block diagram of a time difference unit according to another embodiment of the present disclosure.

Referring to FIG. 11, a block diagram of a time difference unit 110 according to another embodiment of the present disclosure is shown. The first sample-and-hold circuit 111-1 and the second sample-and-hold circuit 111-2 are connected in parallel as indicated in FIG. 9. In another embodiment as indicated in FIG. 11, the first sample-and-hold circuit 111-1 and the second sample-and-hold circuit 111-2 can also be connected in series to perform steps S310 and S320. The time difference signal TDS obtained by the time difference unit 110 of FIG. 11 can be expressed as TDS=S-C2*[S-2], wherein C2=C1'*C2', for example.

Figure 12:
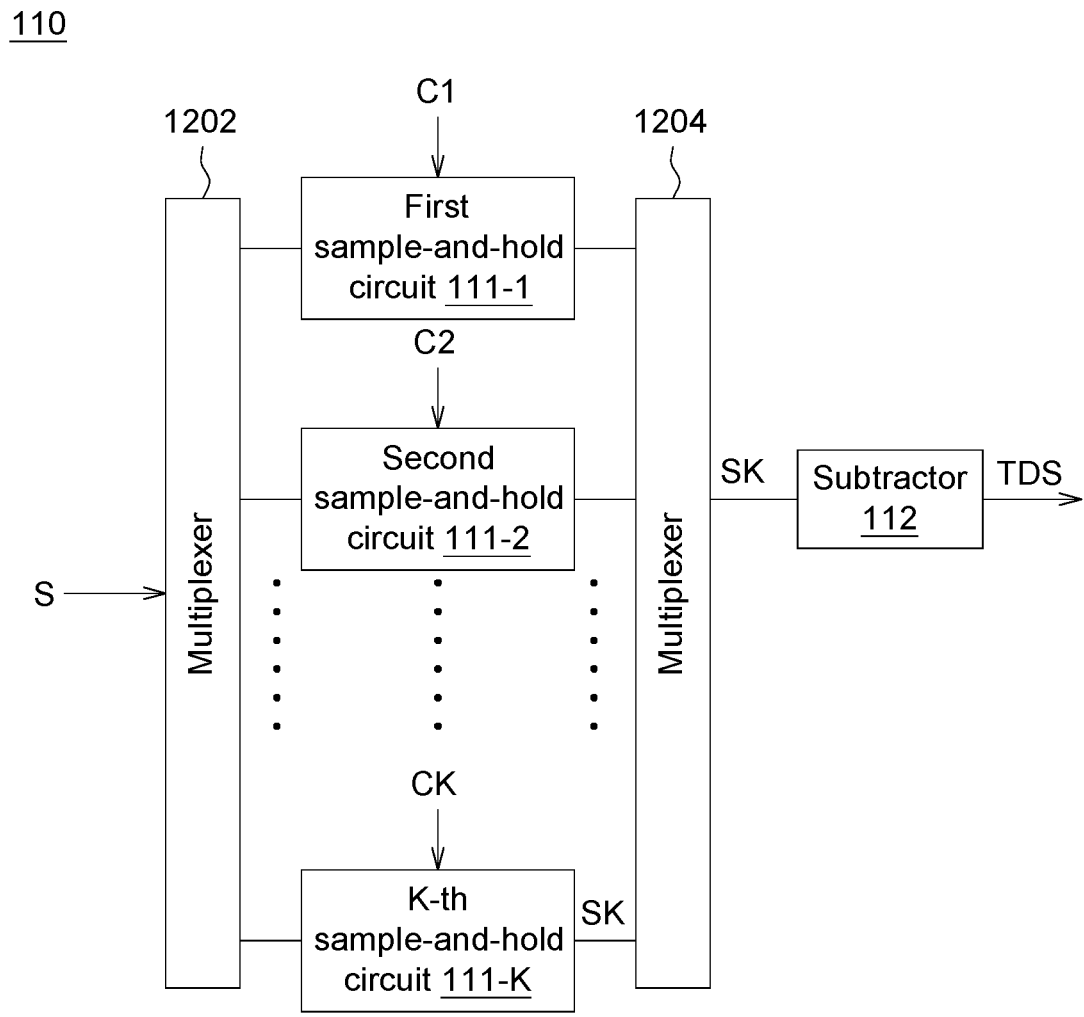
FIG. 12 is a block diagram of a time difference unit according to another embodiment of the present disclosure.

Referring to FIG. 12, a block diagram of a time difference unit 110 according to another embodiment of the present disclosure is shown. In an embodiment, the time difference unit 110 includes a first sample-and-hold circuit 111-1, a second sample-and-hold circuit 111-2, . . . , a K-th sample-and-hold circuit 111-K and a subtractor 112. The first sample-and-hold circuit 111-1, the second sample-and-hold circuit 111-2, . . . and the K-th sample-and-hold circuit 111-K are connected in parallel. A multiplexer 1202 makes the input signal S to be inputted to the first sample-and-hold circuit 111-1, the second sample-and-hold circuit 111-2, . . . , or the K-th sample-and-hold circuit 111-K and another multiplexer 1204 makes the output of the first sample-and-hold circuit 111-1, the output of the second sample-and-hold circuit 111-2, or the output of the K-th sample-and-hold circuit 111-K to be inputted to the subtractor 112 as indicated in FIG. 12. In the exemplification below, the multiplexer 1202 makes the input signal S to be inputted to the K-th sample-and-hold circuit 111-K; the multiplexer 1204 makes the output of the K-th sample-and-hold circuit 111-K to be inputted to the subtractor 112. In the present embodiment, the time difference signal TDS obtained by the time difference unit 110 can be expressed as TDS=S-CK*[S-K], wherein the signal [S-K] is the signal generated by delaying the input signal S by K time units and CK is a K-th coefficient related to the K-th leakage rate and is between 0.5 and 1. The value of the K-th leakage rate is adjustable. The value of the K-th coefficient CK can be determined by adjusting the value of the K-th leakage rate. Operations of the time difference unit 110 by the time difference unit 110 of FIG. 12 are similar to operations of the time difference unit 110 of FIG. 9, and are not repeated here.

Figure 13:
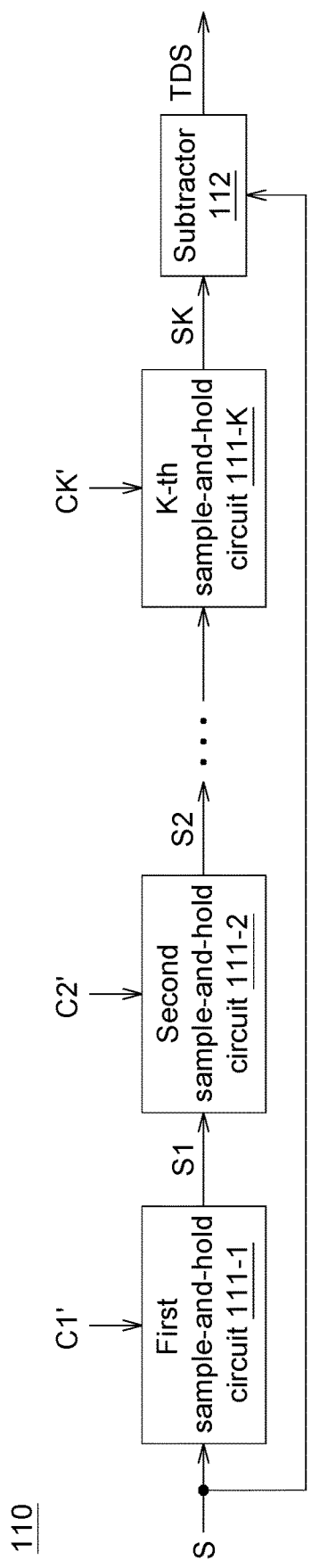
FIG. 13 is a block diagram of a time difference unit according to another embodiment of the present disclosure.

Referring to FIG. 13, a block diagram of a time difference unit 110 according to another embodiment of the present disclosure is shown. The first sample-and-hold circuit 111-1, the second sample-and-hold circuit 111-2, . . . , and the K-th sample-and-hold circuit 111-K are connected in parallel as indicated in FIG. 12. In another embodiment as indicated in FIG. 13, the first sample-and-hold circuit 111-1, the second sample-and-hold circuit 111-2, . . . , and the K-th sample-and-hold circuit 111-K can be connected in series. The time difference signal TDS obtained by the time difference unit 110 of FIG. 13 can be expressed as TDS=S-CK*[S-K], wherein CK=C1'*C2'* . . . *CK', for example.

According to the present disclosure, the time difference calculation can be adjusted by adjusting the leakage rate of the sample-and-hold circuit to obtain the time difference signal. Thus, the prediction accuracy of the low-precision neural network can be increased.

Figure 14:
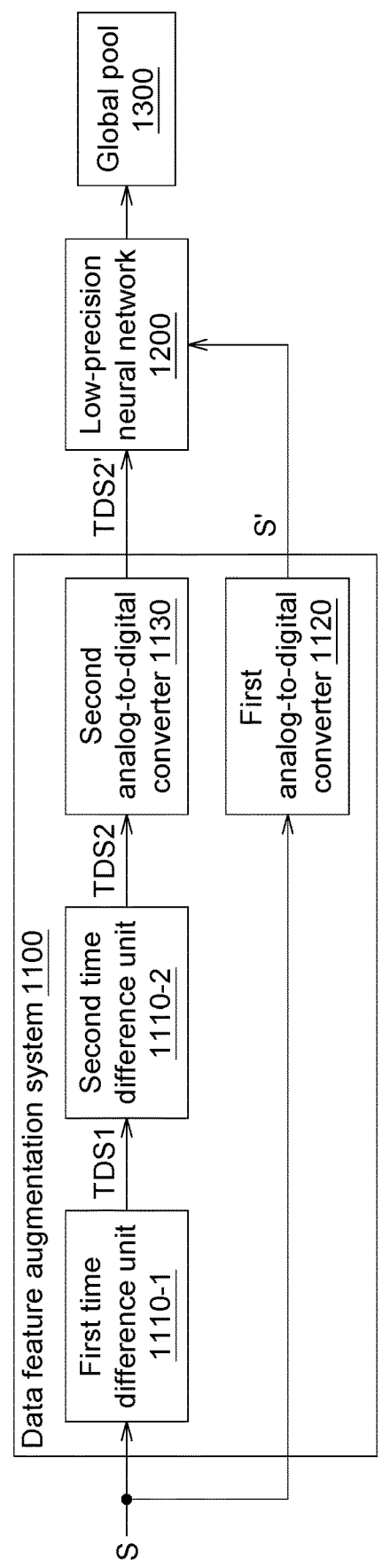
FIG. 14 is a block diagram of a data feature augmentation system according to another embodiment of the present disclosure.

Referring to FIG. 14, a block diagram of a data feature augmentation system 1100 according to another embodiment of the present disclosure is shown. In an embodiment, the data feature augmentation system 1100 includes two time difference units. The data feature augmentation system 1100 includes a first time difference unit 1110-1, a second time difference unit 1110-2 and selectively includes a first analog-to-digital converter 1120 and a second analog-to-digital converter 1130. The first time difference unit 1110-1 and the second time difference unit 1110-2 are connected in series. The first time difference unit 1110-1 can receive an input data, such as an input signal S, and output a first time difference signal TDS1. The input signal S and the first time difference signal TDS1 are analog signals. The first time difference signal TDS1 is inputted to the second time difference unit 1110-2. Then, the second time difference unit 1110-2 outputs a second time difference signal TDS2. The input signal S and the second time difference signal TDS2 can be directly inputted to the low-precision neural network 1200.

In an embodiment, before the input signal S and the second time difference signal TDS2 are inputted to the low-precision neural network 1200, the input signal S and the second time difference signal TDS2 are respectively inputted to the first analog-to-digital converter 1120 and the second analog-to-digital converter 1130. The first analog-to-digital converter 1120 converts the input signal S into a corresponding digital signal S'. The second analog-to-digital converter 1130 converts the second time difference signal TDS2 into a corresponding digital signal TDS2'. Then, the digital signal S' and the second time difference signal TDS2' are inputted to the low-precision neural network 1200. The low-precision neural network 1200 can be a binarized neural network or a short-wordlength neural network. Then, the output of the low-precision neural network 1200 is inputted to the global pool 1300 to be processed with global pooling operation. The first time difference unit 1110-1 and the second time difference unit 1110-2 can be implemented by the time difference unit of any of FIGS. 2, 4, 6, 7, 8, 9, 11, 12, and 13.

In FIG. 14, the data feature augmentation system 1100 exemplarily includes two time difference units, but the present disclosure is not limited thereto. In the present disclosure, the data feature augmentation system 1100 may include more time difference units, and the time difference units are connected in series.

Thus, in the present disclosure, the time difference units connected in series perform time difference calculation on the input signal S to obtain the time difference signal TDS2, such that the feature of the input signal S can be augmented. The input signal S and the time difference signal TDS2 can be used as the input of the low-precision neural network, and the prediction accuracy of the low-precision neural network 1200 can be increased. Furthermore, when it is necessary that the input signal S and the time difference signal TDS2 should be converted to digital signals which are then inputted to low-precision neural network 1200, the low-resolution analog-to-digital converter can be used to save hardware cost without affecting the prediction accuracy of the low-precision neural network 1200.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A data feature augmentation system for a low-precision neural network, comprising:
a first time difference unit, comprising:
a first sample-and-hold circuit, for receiving an input signal and obtaining a first signal according to the input signal, wherein the first signal is related to a first leakage rate of the first sample-and-hold circuit and the first signal is the signal generated by delaying the input signal by one time unit; and
a subtractor, for performing subtraction on the input signal and the first signal to obtain a time difference signal;
wherein the input signal and the time difference signal are inputted to the low-precision neural network.

2. The data feature augmentation system according to claim 1, wherein the input signal, the first signal and the time difference signal are analog signals, and the data feature augmentation system further comprises:
a first analog-to-digital converter; and
a second analog-to-digital converter;
wherein the first analog-to-digital converter and the second analog-to-digital converter are low-resolution analog-to-digital converters, and before the input signal and the time difference signal are inputted to the low-precision neural network, the input signal and the time difference signal are respectively inputted to the first analog-to-digital converter and the second analog-to-digital converter.

3. The data feature augmentation system according to claim 1, wherein the low-precision neural network is a binarized neural network or a short-wordlength neural network.

4. The data feature augmentation system according to claim 1, wherein the first time difference unit further comprises:
a second sample-and-hold circuit, for receiving the input signal and obtaining a second signal according to the input signal, wherein the second signal is related to a second leakage rate of the second sample-and-hold circuit and the second signal is the signal generated by delaying the input signal by two time units;
wherein the subtractor is further used for subtracting the first signal and the second signal from the input signal to obtain the time difference signal.

5. The data feature augmentation system according to claim 4, wherein the first sample-and-hold circuit and the second sample-and-hold circuit are connected in series.

6. The data feature augmentation system according to claim 4, wherein the first sample-and-hold circuit and the second sample-and-hold circuit are connected in parallel.

7. The data feature augmentation system according to claim 4, wherein the first leakage rate and the second leakage rate are adjustable.

8. The data feature augmentation system according to claim 1, wherein the first time difference unit further comprises:
a second sample-and-hold circuit, for receiving the input signal and obtaining a second signal according to the input signal, wherein the second signal is related to a second leakage rate of the second sample-and-hold circuit and the second signal is the signal generated by delaying the input signal by two time units;
wherein the subtractor is further used for subtracting the second signal from the input signal to obtain the time difference signal.

9. The data feature augmentation system according to claim 8, wherein the first sample-and-hold circuit and the second sample-and-hold circuit are connected in series.

10. The data feature augmentation system according to claim 8, wherein the first sample-and-hold circuit and the second sample-and-hold circuit are connected in parallel.

11. The data feature augmentation system according to claim 1, further comprising:
a second time difference unit, serially connected to the first time difference unit for obtaining a second time difference signal according to the time difference signal.

12. A data feature augmentation method for a low-precision neural network, comprising:
receiving an input signal and obtaining a first signal according to the input signal, wherein the first signal is related to a first leakage rate of a first sample-and-hold circuit and the first signal is the signal generated by delaying the input signal by one time unit; and
performing subtraction on the input signal and the first signal to obtain a time difference signal;
wherein the input signal and the time difference signal are inputted to the low-precision neural network.

13. The data feature augmentation method according to claim 12, wherein the input signal, the first signal and the time difference signal are analog signals and the data feature augmentation method further comprises:
before the input signal and the time difference signal are inputted to the low-precision neural network, respectively inputting the input signal and the time difference signal to a first analog-to-digital converter and a second analog-to-digital converter, wherein the first analog-to-digital converter and the second analog-to-digital converter are low-resolution analog-to-digital converters.

14. The data feature augmentation method according to claim 12, wherein the low-precision neural network is a binarized neural network or a short-wordlength neural network.

15. The data feature augmentation method according to claim 12, further comprising:
receiving the input signal and obtaining a second signal according to the input signal, wherein the second signal is related to a second leakage rate of a second sample-and-hold circuit and the second signal is the signal generated by delaying the input signal by two time units; and
subtracting the first signal and the second signal from the input signal to obtain the time difference signal.

16. The data feature augmentation method according to claim 15, wherein the first leakage rate and the second leakage rate are adjustable.

17. The data feature augmentation method according to claim 15, further comprising:
receiving the input signal and obtaining a second signal according to the input signal, wherein the second signal is related to a second leakage rate of the second sample-and-hold circuit and the second signal is the signal generated by delaying the input signal by two time units; and
subtracting the second signal from the input signal to obtain the time difference signal.

* * * * *